(12) United States Patent
Tsuda et al.

(10) Patent No.: US 7,573,924 B2
(45) Date of Patent: Aug. 11, 2009

(54) NITRIDE SEMICONDUCTOR LASER DEVICE

(75) Inventors: Yuhzoh Tsuda, Sakurai (JP); Daisuke Hanaoka, Kyoto (JP); Masaya Ishida, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 203 days.

(21) Appl. No.: 11/127,083

(22) Filed: May 12, 2005

(65) Prior Publication Data

US 2005/0265413 A1    Dec. 1, 2005

(30) Foreign Application Priority Data

May 26, 2004  (JP)  .............. 2004-156306
Mar. 24, 2005 (JP)  .............. 2005-086730

(51) Int. Cl.
  *H01S 5/00*   (2006.01)
  *H01S 3/04*   (2006.01)
  *H01S 3/08*   (2006.01)
(52) U.S. Cl. .................... 372/43.01; 372/34; 372/98
(58) Field of Classification Search .............. 372/43.01, 372/34, 98
  See application file for complete search history.

(56) References Cited

U.S. PATENT DOCUMENTS 4,326,178 A * 4/1982 Van den Brink et al. ...... 372/61
5,233,622 A * 8/1993 Iwamoto ..................... 372/34
5,770,473 A * 6/1998 Hall et al. ................... 438/26
6,396,023 B1  5/2002 Aikiyo
6,847,660 B2 * 1/2005 Morikawa et al. ............. 372/5

FOREIGN PATENT DOCUMENTS

| CN | 1406404 A | 3/2003 |
| JP | 60-186076 | 9/1985 |
| JP | 10-313147 | 11/1998 |

\* cited by examiner

*Primary Examiner*—Armando Rodriguez
*Assistant Examiner*—Patrick Stafford
(74) *Attorney, Agent, or Firm*—Harness, Dickey & Pierce

(57) ABSTRACT

A nitride semiconductor laser device includes a nitride semiconductor laser element having a resonator end surface and capable of emitting light with a wavelength of at most 420 nm, a heat sink joined to the nitride semiconductor laser element, a stem with the heat sink mounted thereon, and a light detecting element mounted on the stem for detecting a laser beam from the nitride semiconductor laser element. The nitride semiconductor laser element, the heat sink and the light detecting element are enclosed within a cap that is joined to the stem, and an atmosphere within the cap has a dew point of at most −30° C. and an oxygen concentration of at most 100 ppm.

11 Claims, 6 Drawing Sheets

NITRIDE SEMICONDUCTOR LASER DEVICE

This nonprovisional application is based on Japanese Patent Application No. 2004-156306 and 2005-086730 filed with the Japan Patent Office on May 26, 2004 and Mar. 24, 2005, respectively, the entire contents of which are hereby incorporated by reference.

BACKGROUND OF THE INVENTION

1. Field of the Invention

The present invention relates to a nitride semiconductor laser device, and particularly to a nitride semiconductor laser device having a characteristic in an atmosphere within a cap in which a nitride semiconductor laser element is enclosed.

2. Description of the Background Art

A conventional semiconductor laser device that can be installed in a vacuum environment or high-pressure environment is disclosed in Japanese Patent Laying-Open No. 10-313147. Details of the disclosed semiconductor laser device are as follows. Referring to FIG. 4, a semiconductor laser source disclosed in Japanese Patent Laying-Open No. 10-313147 includes such components as a semiconductor laser chip 41 emitting a laser beam, a heat sink 42 having its end on which semiconductor laser chip 41 is provided, a stem 43 to which the bottom surface of heat sink 42 is joined, and a light detecting element 44 placed on a surface of stem 43 for monitoring the intensity of the laser beam emitted from semiconductor laser chip 41. On the opposite surface of stem 43, electrode leads 47 respectively for grounding, for driving the semiconductor laser and for the light detecting element are attached. The ground electrode is joined to the stem and rendered electrically conductive, and the electrode for driving the semiconductor laser and the electrode for the light detecting element are joined respectively to semiconductor laser chip 4 and light detecting element 44 by wire bonding (not shown) and rendered electrically conductive.

The semiconductor laser source as shown in FIG. 4 is structured by molding all of semiconductor laser chip 41, heat sink 42, light detecting element 44 and stem 43 except for electrode leads 47, using a light-transmitting plastic material 49 such as synthetic resin. It is disclosed in the aforementioned publication that the packaging in this form allows semiconductor laser chip 41 to be installed in a vacuum environment or high-pressure environment since this form of packaging has no parts like cap and cover glass that lack strength.

Japanese Patent Laying-Open No. 10-313147 also discloses that the internal atmosphere enclosed in a cap made of the light-transmitting plastic material is an inert gas atmosphere, and accordingly the semiconductor laser device can be installed in a vacuum environment or high-pressure environment.

If the semiconductor laser device in the aforementioned publication uses a nitride semiconductor laser element as the semiconductor laser element, an end surface of a resonator (hereinafter "resonator end surface") of the laser element will be blackened. The blackening results in a problem of deterioration in output light intensity of the nitride semiconductor laser element or shortening of the lifetime thereof.

SUMMARY OF THE INVENTION

The present invention has been made for solving the above-described problem of the conventional art and an object of the present invention is to provide a nitride semiconductor laser device, preventing blackening of a resonator end surface of a nitride semiconductor laser element and thereby preventing deterioration in output light intensity or shortening of the lifetime of the nitride semiconductor laser element that is caused by the blackening.

According to an aspect of the present invention, a nitride semiconductor laser device is provided that includes: a nitride semiconductor laser element having a resonator end surface and capable of emitting light with a wavelength of at most 420 nm; and a stem having the nitride semiconductor laser element. The nitride semiconductor laser element is enclosed within a cap that is joined to the stem. An atmosphere within the cap has a dew point of at most −30° C. and an oxygen concentration of at most 100 ppm.

Preferably, the atmosphere has a pressure of at most 1.3 kPa.

Preferably, the atmosphere includes helium.

Preferably, the atmosphere includes nitrogen.

Preferably, the atmosphere has a pressure higher than 100 kPa.

Preferably, the cap has a window and the window has a thickness of at least 0.5 mm and at most 1.0 mm.

Preferably, the cap is joined to the stem with a metal interposed therebetween.

Preferably, a heat sink having the nitride semiconductor laser element is provided within the cap.

Preferably, a light detecting element for detecting a laser beam from the nitride semiconductor laser element is provided within the cap.

According to another aspect of the present invention, an assembly apparatus is provided that assembles any nitride semiconductor laser device as described above and includes: a mechanism capable of assembling the nitride semiconductor laser device fed into the assembly apparatus without opening the inside of the assembly apparatus to outside air; a vacuum mechanism for producing a vacuum within the assembly apparatus; a gas supply mechanism for substituting the inside of the assembly apparatus with a predetermined atmosphere gas; a purge mechanism for discharging the atmosphere gas from the inside to the outside of the assembly apparatus; and a measurement mechanism for detecting oxygen concentration and dew point of the inside of the assembly apparatus.

Preferably, pressure, type of the atmosphere gas, oxygen concentration and dew point of the inside of the assembly apparatus are respectively identical to pressure, type of gas, oxygen concentration and dew point of the atmosphere of the nitride semiconductor laser device.

Preferably, pressure of the inside of the assembly apparatus is a negative pressure or positive pressure with respect to a specified value of the pressure of the atmosphere of the nitride semiconductor laser device.

Preferably, the oxygen concentration of the inside of the assembly apparatus is lower than oxygen concentration of the atmosphere of the nitride semiconductor laser device.

Preferably, the dew point of the inside of the assembly apparatus is lower than dew point of the atmosphere of the nitride semiconductor laser device.

According to still another aspect of the present invention, a method of manufacturing any nitride semiconductor laser device as described above is provided that includes the step of using an assembly apparatus for the nitride semiconductor laser device to feed the nitride semiconductor laser device into the assembly apparatus and assemble the nitride semiconductor laser device without opening the inside of the assembly apparatus to outside air.

Preferably, the method further includes the steps of: producing a vacuum within the assembly apparatus; setting pressure, type of atmosphere gas, oxygen concentration and dew point of the inside of the assembly apparatus respectively identical to pressure, type of gas, oxygen concentration and dew point of the atmosphere of the nitride semiconductor laser device.

Preferably, the method further includes the steps of: producing a vacuum within the assembly apparatus; and setting pressure of the inside of the assembly apparatus to a negative pressure or positive pressure with respect to a specified value of the pressure of the atmosphere of the nitride semiconductor laser device.

Preferably, the method further includes the step of setting oxygen concentration of the inside of the assembly apparatus lower than oxygen concentration of the atmosphere of the nitride semiconductor laser device.

Preferably, the method further includes the step of setting dew point of the inside of the assembly apparatus lower than dew point of the atmosphere of the nitride semiconductor laser device.

Preferably, the method further includes the step of measuring the oxygen concentration and the dew point of the inside of the assembly apparatus.

In the nitride semiconductor laser device of the present invention, the resonator end surface of the nitride semiconductor laser element (laser chip and superluminescent diode) emitting light with a short wavelength of at most 420 nm can be prevented from being blackened with the passage of time, and thus deterioration in output light intensity or shortening of the lifetime of the nitride semiconductor laser element, due to the blackening, can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

According to the present invention, a nitride semiconductor laser device includes a nitride semiconductor laser element having a resonator end surface and capable of emitting light with a wavelength of at most 420 nm as well as a stem having the nitride semiconductor laser element. The nitride semiconductor laser element is enclosed within a cap that is joined to the stem, and an atmosphere within the cap has a dew point of at most −30° C. and an oxygen concentration of at most 100 ppm.

Figure 1:
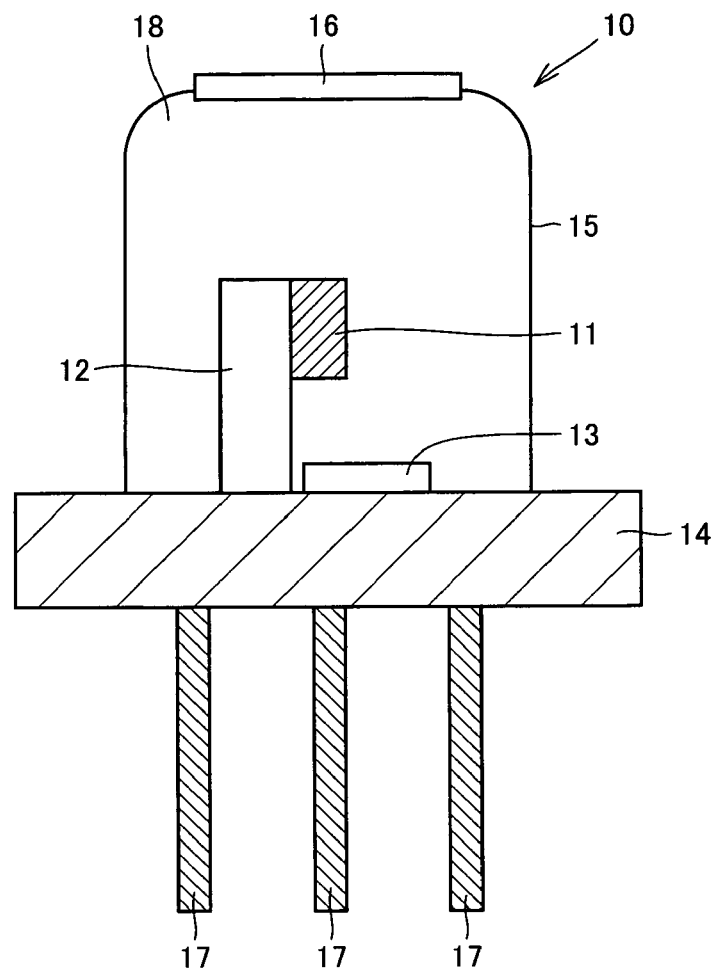
FIG. 1 is a schematic diagram of a nitride semiconductor laser device according to the present invention.

The nitride semiconductor laser device of the present invention is hereinafter described in conjunction with FIG. 1. FIG. 1 is a schematic diagram of the nitride semiconductor laser device of the present invention. It is noted that, while the nitride semiconductor laser device of the present invention basically includes the nitride semiconductor laser element having the resonator end surface and capable of emitting light with a wavelength of at most 420 nm as well as the stem having the nitride semiconductor laser element, the nitride semiconductor laser device may more preferably be implemented in the manner as shown in FIG. 1.

Referring to FIG. 1, nitride semiconductor laser device 10 of the present invention includes a nitride semiconductor laser element 11 emitting a laser beam, a heat sink 12 having an end on which the nitride semiconductor laser element is provided, a stem 14 joined to the bottom surface of heat sink 12, a light detecting element 13 placed on stem 14 for observing the intensity of the laser beam emitted from nitride semiconductor laser element 11, and a cap 15 for enclosing therein nitride semiconductor laser element 11, heat sink 12 and light detecting element 13. The internal space of cap 15 is filled with an enclosed atmosphere 18.

Although heat sink 12 and stem 14 are shown in FIG. 1 as separate components, they may be integrated into a single component. However, according to an increase in output of the nitride semiconductor laser that induces a demand for greater heat dissipation ability, the heat sink unit as shown in FIG. 1 that is made of any material having high thermal conductivity may be provided only in the vicinity of the nitride semiconductor laser element at and around which heat is likely to concentrate, so as to enhance the heat dissipation ability while reducing the cost. For this purpose, heat sink 12 preferably contains at least one material that is different from any material for stem 14 and that is selected from the group consisting of Cu, SiC, Si, Al, AlN and Fe.

Further, although the nitride semiconductor laser element and the heat sink in FIG. 1 are directly joined to each other, the nitride semiconductor laser element and the heat sink may be joined with a submount therebetween. The submount preferably contains SiC or AlN that is excellent in thermal conductivity. For example, the submount to be used may be a submount produced by adding, to SiC microcrystals, beryllium oxide functioning as a binder and then sintering the SiC with the binder added thereto.

Furthermore, although light detecting element 13 may or may not be within the cap, it is preferable that light detecting element 13 is within the cap.

Electrode leads 17 are attached to stem 14 and cap 15 has a window 16 for allowing the laser beam emitted from the nitride semiconductor laser element to be released.

According to the present invention, nitride semiconductor laser element 11 is not limited to a particular one, on the condition that nitride semiconductor laser element 11 has a resonator end surface and is capable of emitting a laser beam having a wavelength of 420 nm or less. Specifically, as the nitride semiconductor laser element, a nitride semiconductor laser diode or nitride semiconductor superluminescent diode may be used.

If nitride semiconductor laser element 11 of the present invention is used in such an environment of the semiconductor laser device as that described above in connection with the conventional art and is driven by drive voltage and drive current that are set at desired ones, the resonator end surface of nitride semiconductor laser element 11 will be blackened with the passage of time. This blackening phenomenon differs from deterioration (Catastrophic Optical Damage (COD) for example) of an end surface of a high-output-power laser that emits light with a longer wavelength (650 nm or 780 nm for example), since this blackening occurs under a low-output-power (30 mW or less) condition that should not normally cause the end-surface deterioration. Although specific causes of the blackening have not been made clear, the inventors of the present invention have examined portions where the blackening occurs to detect such elements as oxygen, silicon and carbon. From this result of the examination, it is presumed that, at and around the resonator end surface from which light with a short wavelength of at most 420 nm is emitted, moisture or oxygen present in the enclosed atmosphere is ionized to cause impurities therearound to be adsorbed by the ions to the resonator end surface, resulting in the blackening.

Further, it is considered that the silicon detected at the blackened portions is generated through the process in which the above-described ions cause any component of the nitride semiconductor laser element, Si atoms of $SiO_2$ for example, to be dissociated from the $SiO_2$ and accordingly the Si atoms are generated as impurities that are adsorbed by the ions to the resonator end surface as described above.

The blackening of the resonator end surface of the nitride semiconductor laser element thus causes deterioration in output light intensity and shortening of the device lifetime.

The present invention successfully solves the blackening problem of the resonator end surface by setting the dew point of enclosed atmosphere 18 in the cap to at most −30° C. and setting the oxygen concentration thereof relative to the whole atmosphere to at most 100 ppm. If the dew point is higher than −30° C., the inside of the cap will be full of moisture of a concentration that is a cause of the blackening problem, and thus the dew point higher than −30° C. is not preferable. More preferably, the dew point is at most −40° C. and is still more preferably at most −60° C.

Furthermore, according to the present invention, if the oxygen concentration is higher than 100 ppm, the inside of the cap will be full of oxygen of a concentration that affects the blackening, and thus the oxygen concentration higher than 100 ppm is not preferable. More preferably, the oxygen concentration is at most 10 ppm.

The present invention thus sets the dew point and the oxygen concentration to reduce respective amounts of moisture and oxygen that are ionized by light of a short wavelength that is emitted from the nitride semiconductor laser element and accordingly can prevent the blackening of the resonator end surface. Moreover, as the blackening is prevented, deterioration in output light intensity as well as shortening of the lifetime of the nitride semiconductor laser element can be prevented.

According to the present invention, when the enclosed atmosphere within the cap has a dew point of at most −40° C. and an oxygen concentration of at most 100 ppm, the value determined by the expression, (the number of blackened elements/the total of laser elements)×100, decreases to approximately 15%. Further, when the dew point is at most −60° C. and the oxygen concentration is at most 10 ppm, this value can be decreased to approximately 10%. In this way, the prevention of deterioration in output light intensity as well as extension of the lifetime can be achieved.

Here, "the number of blackened elements" in the expression refers to the number of nitride semiconductor laser elements with respective resonator end surfaces blackened to suddenly fail catastrophically. Here, the resonator end surface refers to a surface from which laser beams are emitted. The number of blackened elements can be measured by an aging test conducted with the purpose of screening out early failures. Specifically, an optical microscope is used to observe end surfaces of failed elements found through the aging test. Further, "the total of laser elements" in the expression refers to the total number of elements undergoing the aging test. The value determined by the above-described expression, (the number of blackened elements/the total of laser elements)×100, is technically significant in that the value represents the ratio of nitride semiconductor laser elements failed due to blackening of respective resonator end surfaces.

According to the present invention, enclosed atmosphere 18 is preferably in a vacuum state with a pressure of at most 1.3 kPa and is more preferably in a vacuum state with a pressure of at most 130 Pa. The pressure is set at such a value as indicated above to eliminate presence of media ionized by light of a short wavelength around the resonator end surface, and thus blackening of the resonator end surface can more effectively be prevented. In this case, since window 16 having a conventional thickness of 0.3 mm lacks durability, preferably the thickness is at least 0.5 mm to ensure sufficient durability. Because of absorption of light by the window, the thickness of window 16 is preferably at most 1.0 mm.

Figure 2:
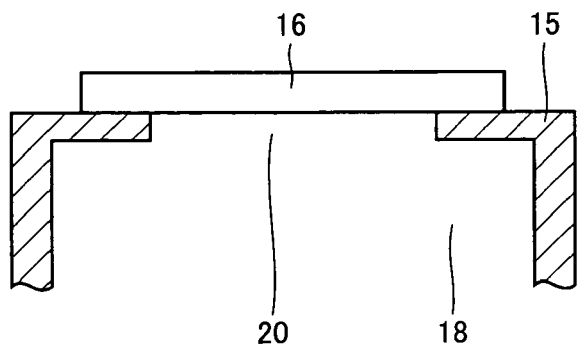
FIG. 2 is a schematic cross sectional view of a structure of a cap at and around a window of the nitride semiconductor laser device of the present invention.

In this case, the inside of cap 15 is lower in pressure than the outside. Therefore, a packaging mechanism that may keep airtightness is necessary. For example, as shown in FIG. 2, window 16 larger than a hole 20 of cap 15 is provided and window 16 is mounted from the outside of cap 15. Further, a metal may be interposed between stem 14 and cap 15 to enhance the airtightness. The metal is deformed to fill any gap between stem 14 and cap 15. For this purpose, the metal is preferably nickel that is readily deformable. Here, FIG. 2 is a schematic cross sectional view showing the structure of the cap near the window.

According to the present invention, enclosed atmosphere 18 has the dew point of at most −30° C. and the oxygen concentration of at most 100 ppm as described above. In addition, enclosed atmosphere 18 preferably contains for example helium, argon, or nitrogen. Blackening of the resonator end surface can accordingly be prevented, since helium and argon are each inert gas and not readily ionized. Further, helium has a superior thermal conductivity so that helium also functions as a heat dissipating medium of the nitride semiconductor laser element. Therefore, helium is highly preferred. Helium thus serves to dissipate heat generated at the resonator end surface and thereby prevent thermal deterioration. Moreover, when the enclosed atmosphere is helium or vacuum as discussed above, the amount of absorbed light with a short wavelength emitted from the nitride semiconductor laser device is relatively smaller as compared with the case in which ambient air or nitrogen is included in the enclosed atmosphere like that of the conventional art. Then, the output light intensity is somewhat higher. Therefore, the helium or vacuum is appropriate.

In addition, in a case where the heat sink and the stem are provided as separate components as shown in FIG. 1, helium may be used as enclosed atmosphere 18 so as to produce a synergetic effect derived from the arrangement of the separate heat sink and stem and the helium used as the enclosed atmosphere. Thus, the effect of heat dissipation is further enhanced.

According to the present invention, an advantage of the use of nitrogen for the enclosed atmosphere within the cap is low cost. However, since nitrogen is hygroscopic, sufficient care should be taken in setting the dew point. As described above, according to the present invention, it is important to set the dew point to at most −30° C., more preferably at most −40° C. and still more preferably at most −60° C.

According to the present invention, when at least one of helium, argon and nitrogen is used for enclosed atmosphere 18, the pressure in enclosed atmosphere 18 is preferably at least 100 kPa. Thus, when the inside of cap 15 is filled with the gas(es), any unintended impurities and gas can be prevented from flowing into cap 15. If the pressure is lower than 100 kPa, the pressure within cap 15 is a negative pressure with respect to the outside air so that the outside air could be drawn into cap 15. Therefore, the pressure lower than 100 kPa is not preferred.

Figure 3:
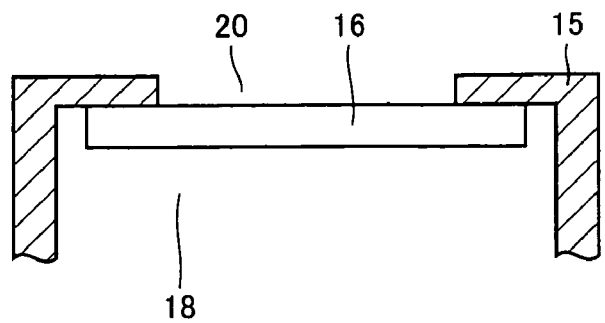
FIG. 3 is a schematic cross sectional view of another structure of the cap at and around the window of the nitride semiconductor laser device of the present invention.
Figure 4:
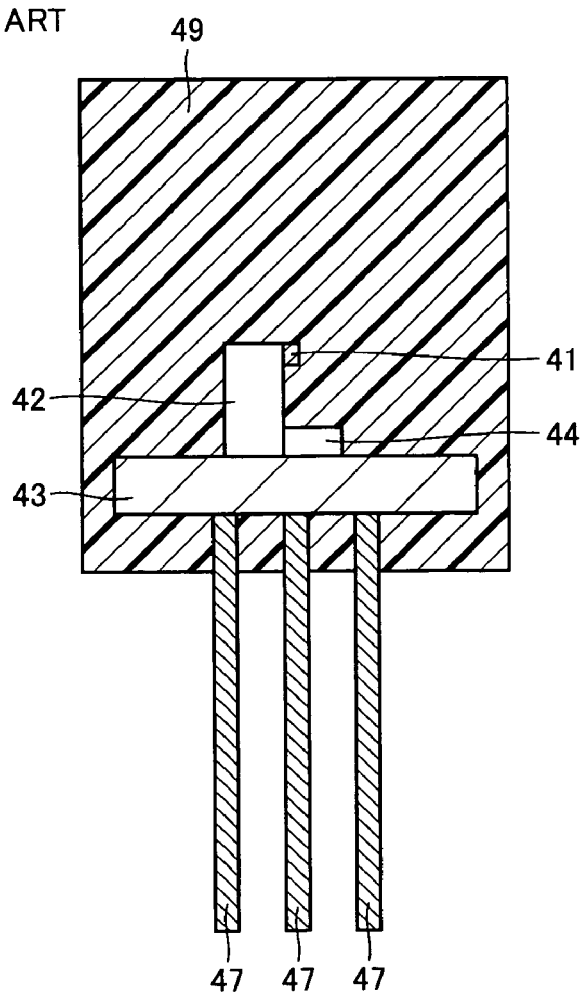
FIG. 4 is a schematic diagram of a conventional semiconductor laser device.

In this case, since the inside of cap 15 is higher in pressure than the outside, a packaging mechanism that may keep airtightness is necessary. For example, as shown in FIG. 3, window 16 larger than hole 20 of cap 15 is provided and window 16 is mounted from the inside of cap 15. FIG. 3 is a schematic cross sectional view showing the structure of the cap near the window. Alternatively, a metal may be interposed between stem 14 and cap 15 to enhance the airtightness. Here, the metal is deformable to fill any gap between stem 14 and cap 15. For this purpose, the metal is preferably nickel.

In the present embodiment, nitride semiconductor laser element 11 and heat sink 12 are directly joined to each other as shown in the schematic diagram of FIG. 1. Alternatively, a submount may be provided between nitride semiconductor laser element 11 and heat sink 12 to join them to each other.

Figure 8:
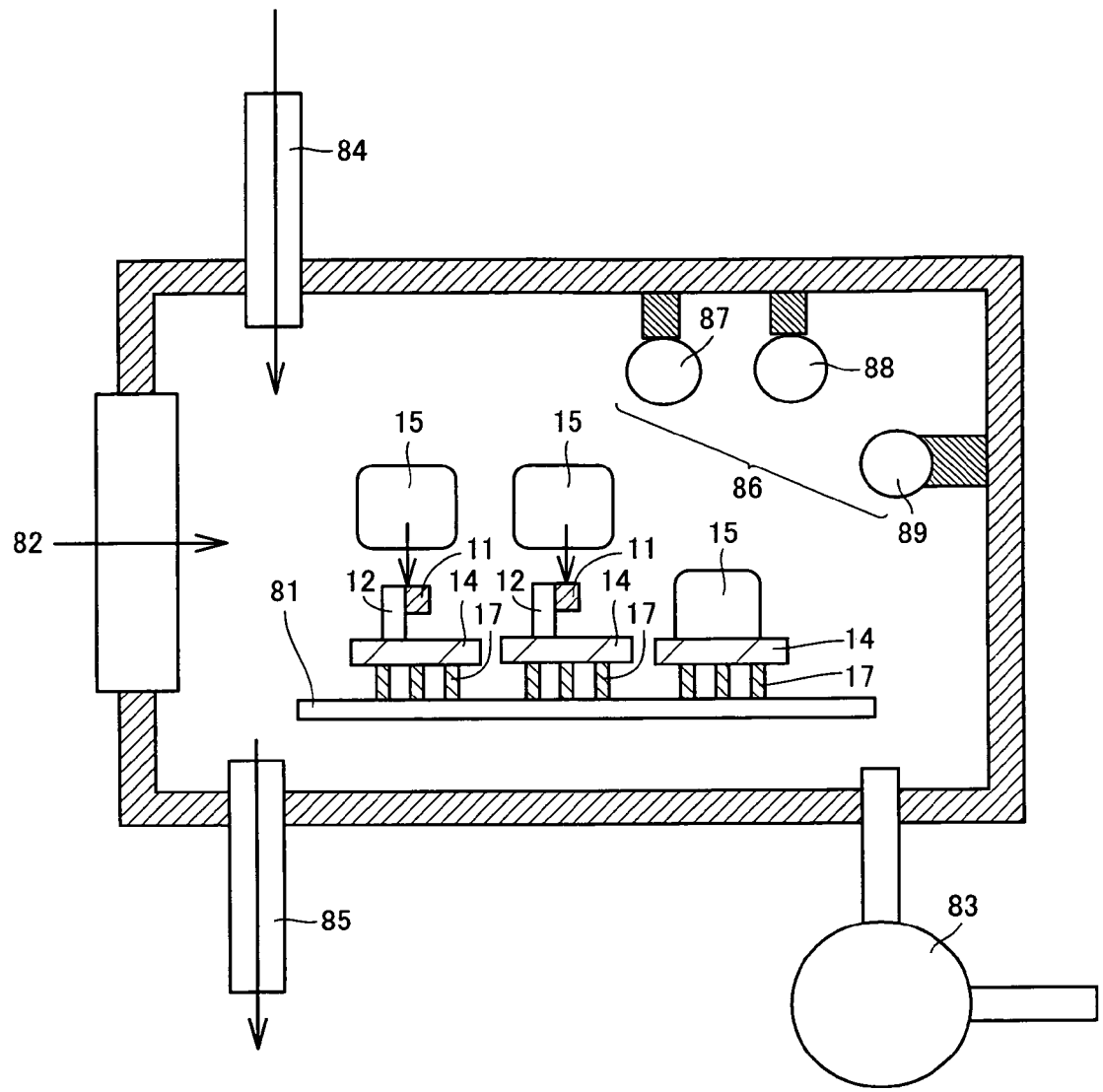
FIG. 8 is a schematic cross sectional view of an assembly apparatus for the nitride semiconductor laser device of the present invention.

According to the present invention, a description is given of an assembly apparatus for assembling a nitride semiconductor laser device. FIG. 8 is a schematic cross sectional view of the assembly apparatus for the nitride semiconductor laser device of the present invention. Nitride semiconductor laser device 10 is fed through a feeding inlet 82 into the assembly apparatus. The assembly apparatus has an assembly mechanism 81 and this assembly mechanism 81 is such a mechanism as glove box that allows the nitride semiconductor laser device fed into the assembly apparatus to be assembled without opening the inside of the assembly apparatus to the outside air. The assembly apparatus includes, for allowing the inside thereof to reach a desired pressure, to include a desired type of atmosphere gas and to reach a desired oxygen concentration and a desired dew point, a vacuum mechanism 83 for producing a vacuum within the assembly apparatus, a gas supply mechanism 84 for filling the inside of the apparatus with a desired atmosphere gas and a purge mechanism 85 for discharging the gas in the apparatus to the outside. As an example of vacuum mechanism 83, a vacuum pump may be used. The vacuum mechanism, however, is not particularly limited to the vacuum pump. The arrows in FIG. 8 indicate a flow of the gas that is adjusted by gas supply mechanism 84 and purge mechanism 85. The assembly apparatus of the present invention at least includes a measurement mechanism 86 for detecting the oxygen concentration and the dew point within the apparatus. Measurement mechanism 86 includes an oxygen concentration meter 87, a dew point meter 88 and a pressure meter 89. Regarding those components in FIG. 8 with respective reference characters that are not described here, the corresponding description above is applied.

The pressure, the type of the atmosphere gas, the oxygen concentration and the dew point within the assembly apparatus may be made identical to the pressure, the type of the enclosed atmosphere gas, the oxygen concentration and the dew point of the enclosed atmosphere of the nitride semiconductor laser device as detailed above. It is thus enough, for obtaining the above-described atmosphere within the cap, to assemble the nitride semiconductor laser device in this assembly apparatus.

When the nitride semiconductor laser device has the mechanism as shown in FIG. 2, the pressure within the assembly apparatus is preferably a negative pressure with respect to a specified value of the pressure of the enclosed atmosphere of the nitride semiconductor laser device. In this way, the number can be reduced of nitride semiconductor laser devices of the present invention that are defective due to the pressure within the cap that does not meet the specified value. When the mechanism as shown in FIG. 3 of the nitride semiconductor laser device is preferred, the pressure within the assembly apparatus is preferably a positive pressure with respect to a specified value of the pressure of the enclosed atmosphere of the nitride semiconductor laser device. Accordingly, the number can be reduced of nitride semiconductor laser devices of the present invention that are defective due to the pressure within the cap that does not meet the specified value.

Furthermore, the oxygen concentration in the assembly apparatus is preferably set lower than a desired oxygen concentration of the enclosed atmosphere of the nitride semiconductor laser device that is to be produced. Accordingly, the nitride semiconductor laser device can surely be assembled while satisfying a desired oxygen concentration.

More preferably, the dew point within the assembly apparatus is set lower than a desired dew point of the enclosed atmosphere of the nitride semiconductor laser device that is to be produced. Thus, the nitride semiconductor laser device can surely be assembled while satisfying a desired dew point.

EXAMPLE 1

As a nitride semiconductor laser element, a semiconductor laser of InGaN having an output wavelength of 410 nm was used to produce a nitride semiconductor laser device as shown in FIG. 1. At this time, the dew point and the oxygen concentration of the enclosed atmosphere were set respectively at −40° C. and 100 ppm. Further, as an enclosed gas, nitrogen was supplied at a pressure of 102660 Pa.

Under the above-described conditions, the ratio of blackened elements was measured. The ratio was approximately 20% or less.

For comparison with the arrangement as shown in FIG. 1 that has the light detecting element enclosed within the cap, an arrangement having the light detecting element outside the nitride semiconductor laser device was examined. It was found that, on a surface of the light detecting element where intense light emitted from the nitride semiconductor laser device is concentrated, blurring of the surface occurred. The blurring of the surface of the light detecting element causes a problem that a laser beam emitted from the nitride semiconductor laser device cannot accurately be detected.

The reason for the blurring is presumably similar to that of the above-described blackening occurring on the resonator end surface. This blurring phenomenon does not occur to a laser that emits light of a long wavelength (650 nm or 780 nm for example). Therefore, this blurring problem is considered as a problem that is specific to a nitride semiconductor laser device emitting light with a short wavelength (at most 420 nm).

The present invention can also prevent the blurring of the surface of the light detecting element, as described in connection with Example 1 above, by enclosing in the cap of the nitride semiconductor laser device the light detecting element together with the nitride semiconductor laser element and the enclosed atmosphere of the present invention.

EXAMPLE 2

Figure 5:
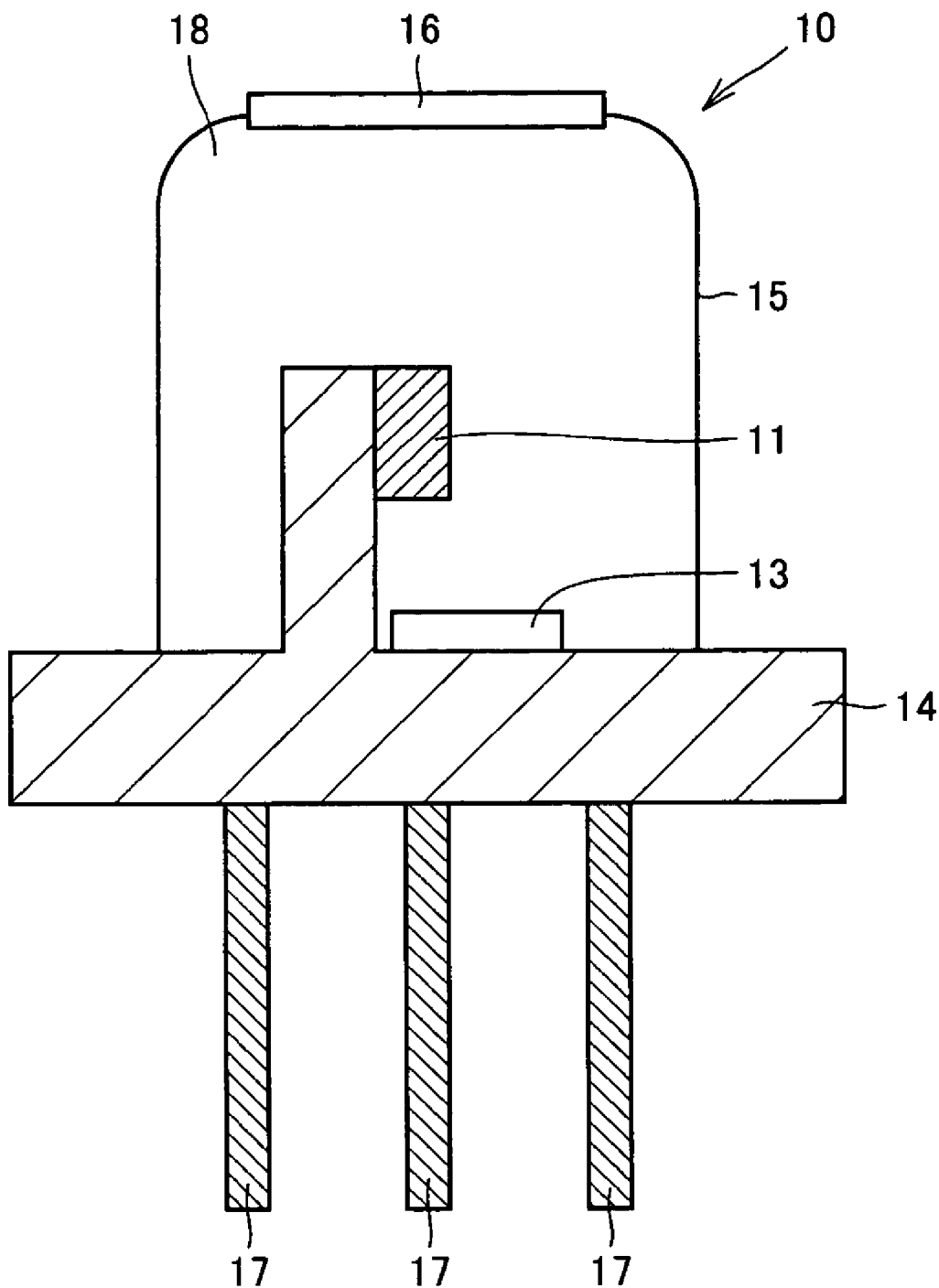
FIGS. 5 to 7 are each a schematic diagram showing an example of the nitride semiconductor laser device according to the present invention.

A nitride semiconductor laser device of Example 2 differs from that of Example 1 (FIG. 1) in that heat sink 12 and stem 14 are integrated into one component or stem 14 has a protrusion that supports a nitride semiconductor laser element as shown in FIG. 5. Other structural features as well as the effects derived therefrom are similar to those as shown in FIG. 1.

When the heat sink and the stem are provided as an integrated component or the stem has the protrusion supporting the nitride semiconductor laser element (hereinafter referred to as integrated stem), because of the fact that the heat sink portion and the stem portion are constituted of the same material, the heat sink portion and the stem portion and respective functions cannot be distinguished from each other, as shown in FIG. 5. Thus, heat sink 12 and stem 14 are not regarded as separate components as shown in FIG. 1. Instead, the heat sink and the stem may be regarded as a single stem 14 as shown in FIG. 5. Example 2 thus provides an exemplary arrangement using such an integrated stem.

Integrated stem 14 is advantageous in that the process of producing the stem can be simplified to contribute to a reduction in cost. Although respective functions of respective portions of the integrated stem cannot be distinguished from each other, for allowing the whole stem to function as a heat sink, namely for enhancing the heat dissipation ability, the stem may by made of a material selected from for example Cu, Al and Fe.

A nitride semiconductor laser device of the present invention using this integrated stem is now described in connection with FIG. 5. FIG. 5 is a schematic diagram of the nitride semiconductor laser device of the present invention using this integrated stem. Referring to FIG. 5, nitride semiconductor laser device 10 of the present invention includes a nitride semiconductor laser element 11 emitting a laser beam, a stem 14 having thereon the nitride semiconductor laser element, a light detecting element 13 placed on stem 14 for observing the intensity of the laser beam emitted from nitride semiconductor laser element 11, and a cap 15 for enclosing therein nitride semiconductor laser element 11 and light detecting element 13. The internal space of cap 15 is filled with an enclosed atmosphere 18. Further, electrode leads 17 are attached to stem 14 and cap 15 has a window 16 for allowing the laser beam emitted from the nitride semiconductor laser element to be released.

Although nitride semiconductor laser element 11 and stem 14 in FIG. 5 are directly joined to each other, nitride semiconductor laser element 11 and stem 14 may be joined with a submount therebetween. The submount preferably contains SiC or AlN that is excellent in thermal conductivity. For example, the submount to be used may be produced by adding, to SiC microcrystals, beryllium oxide functioning as a binder and then sintering the SiC with the binder added thereto.

EXAMPLE 3

A nitride semiconductor laser device of Example 3 differs from that of Example 1 (FIG. 1) in that no light detecting element is provided. Other structural features as well as the effects derived therefrom are similar to those of Example 1 or Example 2.

Figure 6:
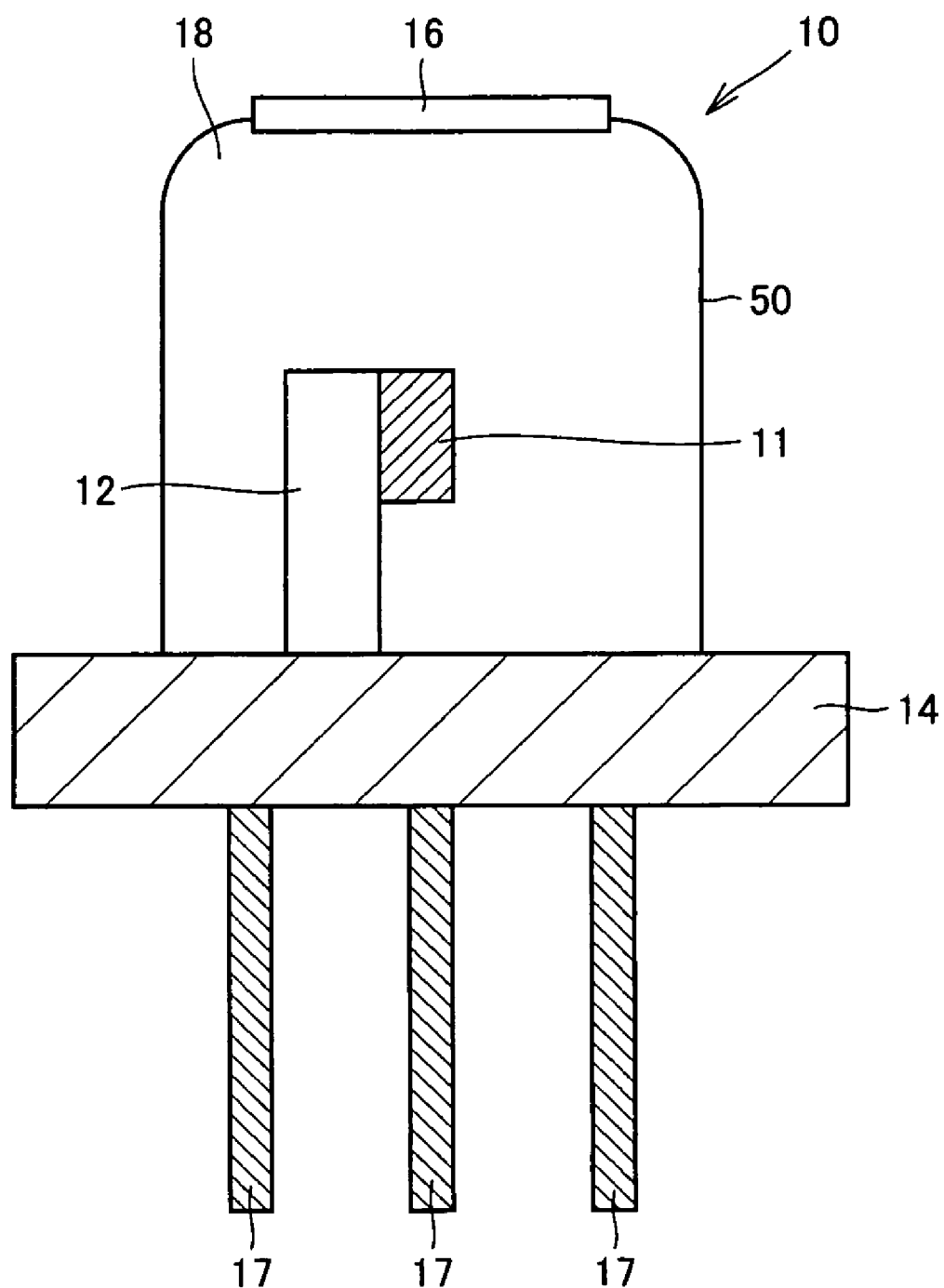

The nitride semiconductor laser device of the present invention in Example 3 is described in connection with FIG. 6. FIG. 6 is a schematic diagram of the nitride semiconductor laser device of the present invention without the light detecting element. Referring to FIG. 6, nitride semiconductor laser device 10 of the present invention includes a nitride semiconductor laser element 11 emitting a laser beam, a heat sink 12 having an end on which the nitride semiconductor laser element is provided, a stem 14 joined to the bottom surface of heat sink 12, and a cap 15 for enclosing therein nitride semiconductor laser element 11 and heat sink 12. The internal space of cap 15 is filled with an enclosed atmosphere 18. Further, electrode leads 17 are attached to stem 14 and cap 15 has a window 16 for allowing the laser beam emitted from the nitride semiconductor laser element to be released. Although nitride semiconductor laser element 11 and heat sink 12 in the schematic diagram of FIG. 6 are directly joined to each other, nitride semiconductor laser element 11 and heat sink 12 may be joined with a submount therebetween. The submount preferably contains SiC or AlN that is excellent in thermal conductivity. For example, the submount to be used may be produced by adding, to SiC microcrystals, beryllium oxide functioning as a binder and then sintering the SiC with the binder added thereto.

The structure of Example 3 also provides the effects of the nitride semiconductor laser element similar to those of Examples 1 and 2.

EXAMPLE 4

A nitride semiconductor laser device of Example 4 differs from that of Example 1 (FIG. 1) in that no light detecting element is provided and the integrated stem of Example 2 is used. Other structural features as well as the effects derived therefrom are similar to those of Example 1 and Example 2.

The nitride semiconductor laser device of the present invention in Example 4 is described in connection with FIG. 7.

Figure 7:
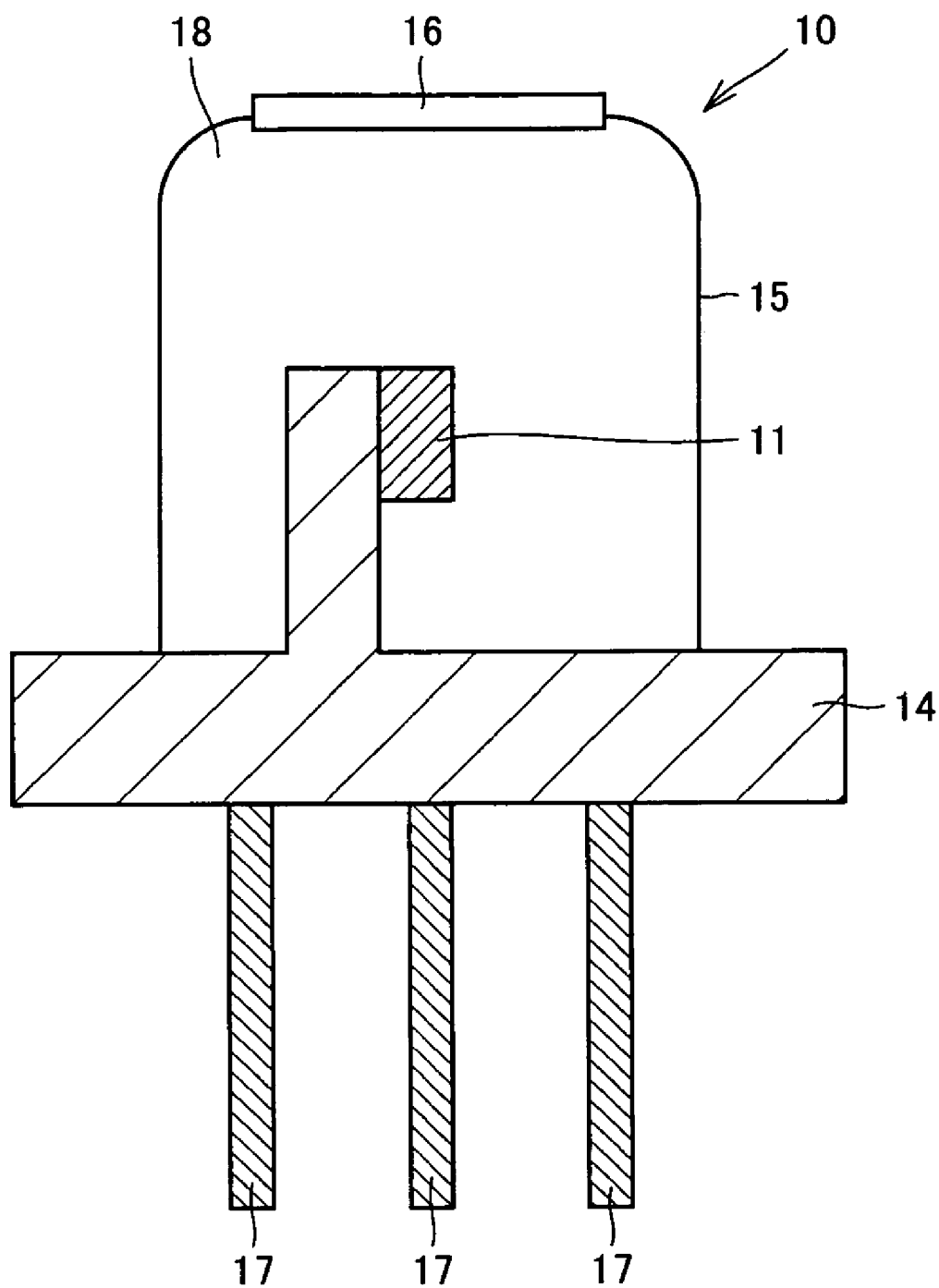

FIG. 7 is a schematic diagram of the nitride semiconductor laser device of the present invention. Referring to FIG. 7, nitride semiconductor laser device 10 of the present invention includes a nitride semiconductor laser element 11 emitting a laser beam, a stem 14 having thereon the nitride semiconductor laser element, and a cap 15 for enclosing therein nitride semiconductor laser element 11. The internal space of cap 15 is filled with an enclosed atmosphere 18. Further, electrode leads 17 are attached to stem 14 and cap 15 has a window 16 for allowing the laser beam emitted from the nitride semiconductor laser element to be released. Stem 14 is preferably made of Cu, Al or Fe for example. Although nitride semiconductor laser element 11 and stem 14 in the schematic diagram of FIG. 7 are directly joined to each other, nitride semiconductor laser element 11 and stem 14 may be joined with a submount therebetween. The submount preferably contains SiC or AlN that is excellent in thermal conductivity. For example, the submount to be used may be produced by adding, to SiC microcrystals, beryllium oxide functioning as a binder and then sintering the SiC with the binder added thereto.

The nitride semiconductor laser element of Example 4 also provides the effects similar to those of Example 1 or Example 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor laser device comprising:
   a nitride semiconductor laser element having a resonator end surface; and
   a stem having said nitride semiconductor laser element, wherein
   said nitride semiconductor laser element is enclosed within a cap that is joined to said stem, and
   an atmosphere hermetically sealed within said cap the atmosphere having a dew point of at most $-30°$ C. and an oxygen concentration of at most 100 ppm, wherein
   said atmosphere comprises at least one selected from a group consisting of helium, argon, and nitrogen, and said atmosphere has a pressure higher than 100 kPa,
   wherein the nitride semiconductor laser element is capable of emitting light with a wavelength of at most 420 nm.

2. The nitride semiconductor laser device according to claim 1, wherein
   said atmosphere includes helium.

3. The nitride semiconductor laser device according to claim 1, wherein
   said atmosphere includes nitrogen.

4. The nitride semiconductor laser device according to claim 2, wherein
   said atmosphere has a pressure higher than 100 kPa.

5. The nitride semiconductor laser device according to claim 3, wherein
   said atmosphere has a pressure higher than 100 kPa.

6. The nitride semiconductor laser device according to claim 1, wherein
   said cap has a window and said window has a thickness of at least 0.5 mm and at most 1.0 mm.

7. The nitride semiconductor laser device according to claim 1, wherein
   said cap is joined to said stem with a metal interposed therebetween.

8. The nitride semiconductor laser device according to claim 1, wherein
   a heat sink having said nitride semiconductor laser element is provided within said cap.

9. The nitride semiconductor laser device according to claim 1, wherein
   a light detecting element for detecting a laser beam from said nitride semiconductor laser element is provided within said cap.

10. The nitride semiconductor laser device according to claim 1, wherein the atmosphere comprises at least one selected from a group consisting of helium, argon, and nitrogen, and said atmosphere has a pressure higher than 100 kPa.

11. The nitride semiconductor laser device according to claim 1, further including a window in said cap for allowing a laser beam emitted from said nitride semiconductor laser element, wherein
    said window is larger than a hole of said cap, and
    said window is mounted from the inside of said cap so as to cover said hole.

* * * * *